US012566302B2

(12) United States Patent
Weng et al.

(10) Patent No.: US 12,566,302 B2
(45) Date of Patent: Mar. 3, 2026

(54) PACKAGE STRUCTURE AND METHOD OF FORMING THE SAME

(71) Applicant: Taiwan Semiconductor Manufacturing Company, Ltd., Hsinchu (TW)

(72) Inventors: Chung-Ming Weng, Taichung City (TW); Yu-Hao Chen, HsinChu City (TW); Hao-Yi Tsai, Hsinchu City (TW); An-Jhih Su, Taoyuan City (TW); Tzuan-Horng Liu, Taoyuan City (TW); Po-Yuan Teng, Hsinchu City (TW); Tsung-Yuan Yu, Taipei City (TW); Che-Hsiang Hsu, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 260 days.

(21) Appl. No.: 18/479,117

(22) Filed: Oct. 2, 2023

(65) Prior Publication Data

US 2025/0110291 A1     Apr. 3, 2025

(51) Int. Cl.
| | |
|---|---|
| *G02B 6/42* | (2006.01) |
| *H01L 23/00* | (2006.01) |
| *H01L 23/48* | (2006.01) |
| *H01L 25/16* | (2023.01) |
| *H01L 25/18* | (2023.01) |

(52) U.S. Cl.
CPC .......... *G02B 6/4206* (2013.01); *H01L 23/481* (2013.01); *H01L 24/05* (2013.01); *H01L 25/167* (2013.01); *H01L 25/18* (2013.01);

*H01L 2224/0401* (2013.01); *H01L 2224/05008* (2013.01); *H01L 2924/12042* (2013.01)

(58) Field of Classification Search
None
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,715,064 B1 * | 7/2017 | Gambino ................. G02B 6/43 |
| 10,162,139 B1 * | 12/2018 | Wang ..................... G02B 6/122 |
| 10,243,322 B2 * | 3/2019 | Mahgerefteh ...... G02B 6/12004 |

(Continued)

*Primary Examiner* — Jerry Rahll
(74) *Attorney, Agent, or Firm* — JCIPRNET

(57) ABSTRACT

Provided are a package structure and a method of forming the same. The package structure includes a bottom package having a first sidewall and a second sidewall opposite to each other; a hybrid path layer disposed on the bottom package, wherein the hybrid path layer comprises an optical path layer and an electrical path layer, and at least one optical path of the optical path layer extends from the first sidewall of the bottom package beyond a center of the bottom package; and a plurality of dies bonded onto the hybrid path layer.

20 Claims, 10 Drawing Sheets

(56) References Cited

U.S. PATENT DOCUMENTS

| | | | | |
|---|---|---|---|---|
| 10,333,623 | B1 * | 6/2019 | Liao | H10H 20/857 |
| 2016/0238793 | A1 * | 8/2016 | Frankel | G02B 6/14 |
| 2017/0194310 | A1 * | 7/2017 | Evans | G02F 1/2255 |
| 2018/0314003 | A1 * | 11/2018 | Coolbaugh | G02B 6/4232 |
| 2020/0411333 | A1 * | 12/2020 | Yu | G02B 6/136 |
| 2021/0091056 | A1 * | 3/2021 | Yu | G02B 6/4214 |
| 2022/0283368 | A1 * | 9/2022 | Chen | G02B 6/4257 |

\* cited by examiner

PACKAGE STRUCTURE AND METHOD OF FORMING THE SAME

BACKGROUND

The semiconductor industry has experienced rapid growth due to continuous improvements in the integration density of a variety of circuit components (e.g., transistors, diodes, resistors, capacitors, etc.). For the most part, this improvement in integration density has come from repeated reductions in minimum feature size, which allows more components to be integrated into a given area. Currently, System-on-Integrated-Circuit (SoIC) components are becoming increasingly popular for their multi-functions and compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
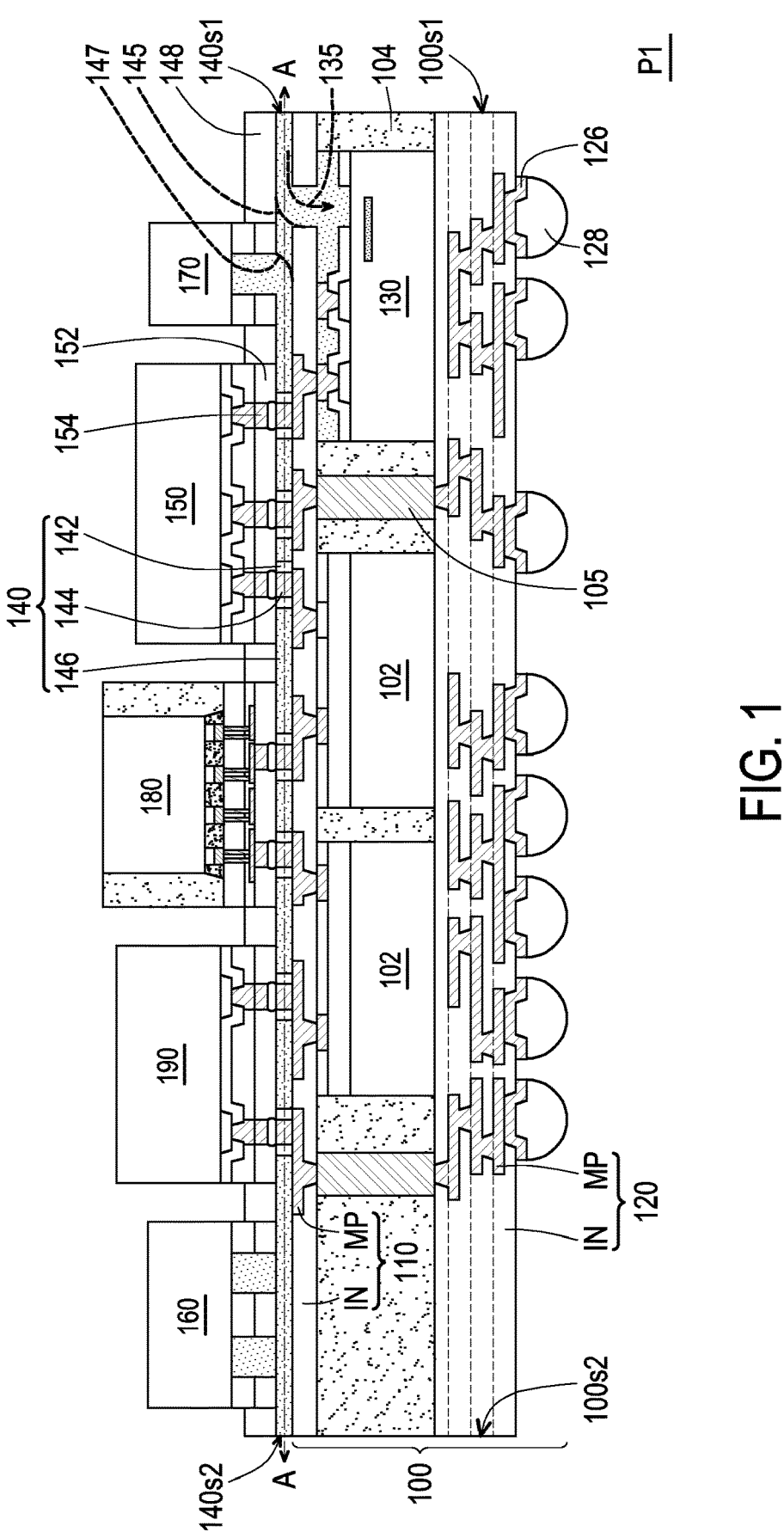
FIG. 1 is a cross-sectional view showing a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments described herein disclose structures and process flow for integrated photonic-electric IC packages by using polymer waveguides. With optical interconnections provided by polymer waveguides, substantially higher communication performance and more compact structures can be achieved in wafer level platforms, in accordance with various embodiments. These embodiments with polymer waveguides can be compatible with an InFO platform. Additionally, polymer waveguides can support inter-layer optical coupling in wafer-level systems.

Silicon Photonics (SiPh) is a combination of the silicon integrated circuit and the semiconductor laser. It enables faster data transfer over longer distances compared to traditional electronics. SiPh techniques typically use silicon as a medium for optical signal transmission and can be a material platform for fabricating photonic integrated circuits (PICs). The silicon can be patterned with sub-micrometer precision into photonic components. A major advantage of SiPh include the potential to integrate optical and electronic devices within the same IC and its compatibility with the existing complementary metal-oxide semiconductor process (CMOS) for fabrication.

The present disclosure provides a package structure with a hybrid path layer having an optical path layer and an electrical path layer extending on the same plane. In such embodiment, the package structure can achieve high speed optical way and have more optical devices bonded in the same level of the package structure, so that the configuration of the package structure is more flexible.

Figure 2:
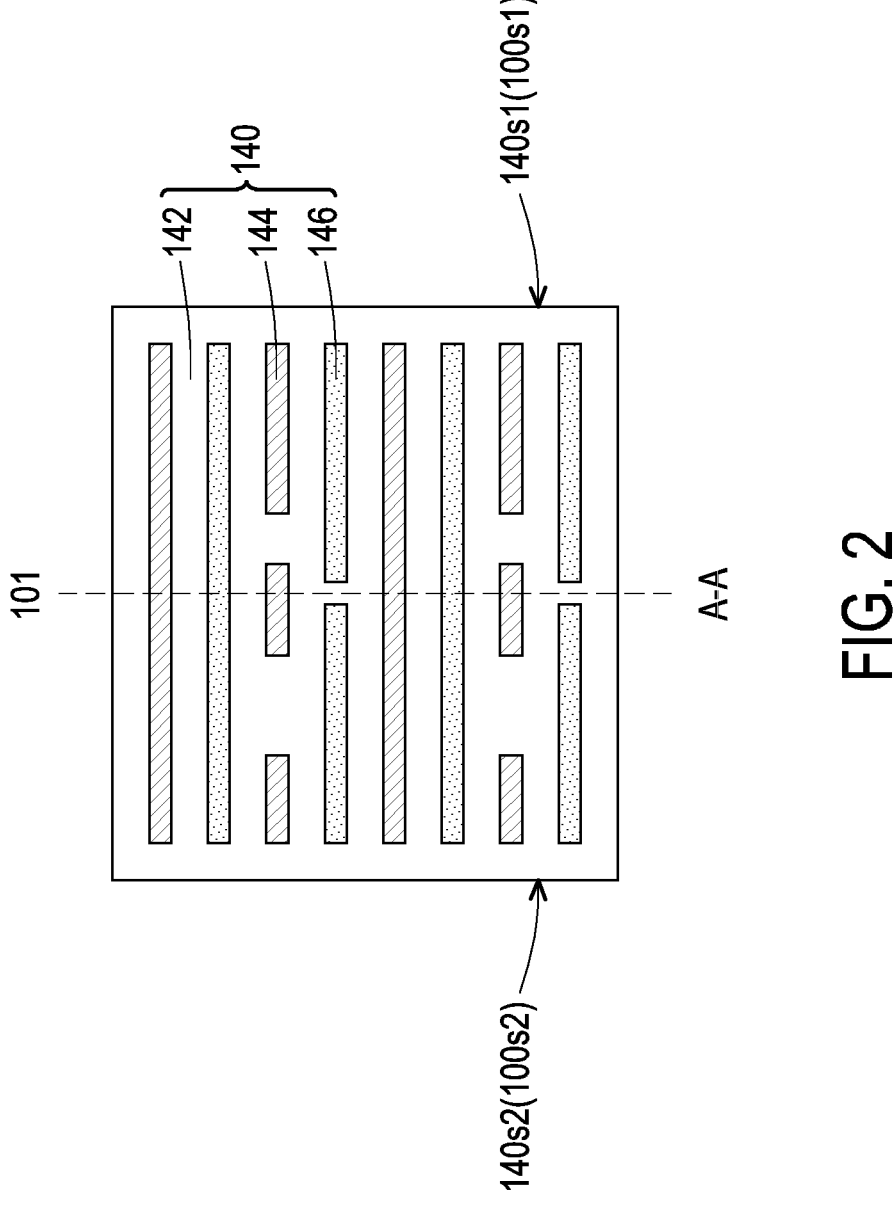
FIG. 2 is a plan view showing a hybrid path layer of the package structure along the line A-A of FIG. 1 in accordance with some embodiments.

FIG. 1 is a cross-sectional view showing a package structure in accordance with some embodiments. FIG. 2 is a plan view showing a hybrid path layer of the package structure along the line A-A of FIG. 1 in accordance with some embodiments.

Referring to FIG. 1, a package structure P1 may include a bottom package 100, a hybrid path layer 140, and a plurality of dies 150, 160, 170, 180, and 190. Specifically, the bottom package 100 may include one or more interconnect dies 102, an encapsulant 104, a plurality of through vias 105, a first redistribution structure 110, and a second redistribution structure 120, under-bump metallizations (UBM) 126, and conductive connectors 128.

In some embodiments, the interconnect die 102 is a local silicon interconnect (LSI) die to interconnect at least two dies of the plurality of dies 150, 160, 170, 180, and 190, thereby allowing for greater die-to-die routing capacity. That is, compared with the conventional redistribution lines (RDLs), the LSI die 102 has the greater routing density and transmission speed to achieve good bandwidth (BW) scalability and chip miniaturization. In some alternative embodiments, the dies 102 also have other functions other than interconnection. For example, the dies 102 may have active and/or passive components, such as diodes, transistors, image sensors, capacitors, resistors, and so on. In some alternative embodiments, the dies 102 includes a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The through vias 105 are disposed aside the interconnect dies 102, and the through vias 105 and the interconnect dies 102 are laterally encapsulated by the encapsulant 104. The encapsulant 104 may be a molding compound, epoxy, or the like. The encapsulant 104 may be applied by compression molding, transfer molding, or the like. The encapsulant 104 may be applied in liquid or semi-liquid form and then subsequently cured. In some alternative embodiments, the encapsulant 104 includes a photo-sensitive material such as PBO, polyimide, BCB, a combination thereof, or the like, which may be easily patterned by exposure and development processes.

In some embodiments, the through vias 105 penetrate through the encapsulant 104 to electrically connect the first redistribution structure 110 and the second redistribution structure 120 which are located on opposite sides of the encapsulant 104. For example, the first redistribution structure 110 is disposed on a top surface of the encapsulant 104, and the second redistribution structure 120 is disposed on a bottom surface of the encapsulant 104.

Each of the first redistribution structure 110 and the second redistribution structure 120 includes insulating layers IN and metallization patterns MP alternately disposed on the encapsulant 104. The insulating layers IN may be formed of a photo-sensitive material (such as PBO, polyimide, BCB, or the like) or a non-photo-sensitive material (such as silicon oxide, silicon nitride, or the like). The insulating layers IN may be formed by spin coating, lamination, CVD, the like, or a combination thereof, and may be patterned by exposing and developing processes or etching processes. The metallization patterns MP may also be referred to as redistribution layers or redistribution lines. The metallization patterns MP include metal lines and vias formed in one or more insulating layers IN. In some embodiments, the metallization patterns MP may include a conductive material such as copper, silver, gold, tungsten, aluminum, combinations thereof, or the like, and may be formed through any acceptable process, such as a damascene process, a dual damascene process, or the like.

In some embodiments, the under-bump metallizations 126 are disposed on and electrically couple to the second redistribution structure 120. The under-bump metallizations 126 may be formed of the same material as the metallization pattern MP.

In some embodiments, the conductive connectors 128 are disposed on the under-bump metallizations 126. The conductive connectors 128 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 128 may include a conductive material such as solder, copper, aluminum, gold, nickel, silver, palladium, tin, the like, or a combination thereof. In some embodiments, the conductive connectors 128 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 128 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

It should be noted that, in the present embodiment, the bottom package 100 further includes a photonic integrated circuit (PIC) die 130 embedded in the encapsulant 104. Specifically, the PIC die 130 is a device that integrates multiple photonic functions. The PIC process signals may be imposed on optical beams from the optical fiber. These optical beams typically have wavelengths ranging from the UV/visible spectrum (200-750 nm) to near Infrared spectrum (750 nm-1650 nm). The materials used for the fabrication of PICs include, but are not limited to, silica ($SiO_2$) on silicon, silicon on insulator (SOI), various polymers and compound semiconductor materials such as GaAs, InP, and GaN.

Integrated photonic devices can be classified into "passive photonic devices" that do not consume or exchange energy; "emissive/absorptive photonic devices" that involve light emission, optical gain, and absorption, or electronic energy level transitions that give rise to the spontaneous emission, stimulated emission, or absorption of photons; "electro-optic devices" that require an applied electrical voltage or current but do not require optical emission/absorption for their main functionalities; and nonlinear optical devices that involve nonlinear-optical properties of materials.

Passive photonic devices include, but are not limited to, optical beam splitters, optical wavelength filters, optical resonators, optical waveguides, optical wavelength multiplexers, optical couplers, optical polarizers, optical isolators, polarization rotators, etc. Emissive photonic devices include, but are not limited to, optical amplifiers, lasers, and light-emitting devices. Absorptive photonic devices include photodetectors, etc. Electro-optic devices include, but are not limited to, electro-optic modulators, electro-optic phase shifters, electro-optic switches, etc. Nonlinear-optical devices include second harmonic generators, photonic transistor, and all-optical switches, etc. Emissive/absorptive, electro-optic, and nonlinear optical devices together are part of "active devices" that are devices that consume or exchange energy.

Beside the above, there are other active devices such as opto-mechanical devices that involve mechanical power but the above are the main classes of active photonic devices of interest here. These active devices of interest are sometimes classified into optoelectronic devices (those that involve applied electrical power) and all optical devices that do not involve applied electrical power. All optical devices are typically devices that involve direct interaction of light with light. These nomenclatures are not always precise in usage and are defined above specifically for their application here.

Referring to FIG. 1 and FIG. 2, the hybrid path layer 140 may include a dielectric layer 142, an electrical path layer 144, and an optical path layer 146. Specifically, the electrical path layer 144 and the optical path layer 146 are disposed in the dielectric layer 142 and extending on the same plane, as shown in FIG. 2. In some embodiments, at least one optical path of the optical path layer 146 extends from a first sidewall 100s1 of the bottom package 100 beyond a center 101 of the bottom package 100. For example, the at least one optical path of the optical path layer 146 may extend from the first sidewall 100s1 of the bottom package 100 to a second sidewall 100s2 opposite to the first sidewall 100s1. From another point of view, the at least one optical path of the optical path layer 146 may extend from a first side 140s1 of the hybrid path 140 to a second side 140s2 of the hybrid path 140, as shown in FIG. 2. In this case, the optical path layer 146 may be referred to as the optical highway to carry the light signal between the first sidewall 100s1 and the second sidewall 100s2 of the bottom package 100. In some embodiments, the PIC die 130 is configured to optically coupled to the optical fiber (not shown) at the first side 140s1 of the hybrid path layer 140 through the optical path layer 146. In the conventional package structure with the optical path layer, the optical path layer usually occupies only a small part of the edge of the package to transmit the optical signal from the optical fiber at one sidewall of the package to the optical device near the sidewall of the package. Compared with the conventional package structure, the package structure P1 provides the at least one optical path of the optical path layer 146 extending from the first sidewall 100s1 of the bottom package 100 beyond the center 101 of the bottom package 100, and even further extending to the second sidewall 100s2 of the bottom package 100. In this case, the high-speed optical way of the package structure P1 can be achieved and more optical devices can be bonded in the same level of the package structure P1, so that the configuration of the package structure P1 is more flexible.

In addition, the optical path layer 146 may be separated from the electrical path layer 144 by the dielectric layer 142. In some embodiments, the dielectric layer 142 may laterally surround the electrical path layer 144 and the optical path layer 146. The optical path layer 146 provides a polymer waveguide's core layer, in accordance with some embodiments. To support the design of the waveguide, the refractive index of the optical path layer 146 is greater than the refractive index of the dielectric layer 142 to meet the condition of total internal reflection. Polymers can be selected for the dielectric layer 142 and the optical path layer 146 in order to achieve the desired refractive index relationships.

Although the plan view of FIG. 2 illustrates any two optical paths of the optical path layer 146 extending parallel in the same direction, the embodiment of the disclosure is not limited thereto. In other embodiments, any two optical paths of the optical path layer 146 may interconnect to each other in the same plane according to the design requirements.

As shown in FIG. 1, the dies 150, 160, 170, 180, and 190 may be bonded onto the hybrid path layer 140. It should be noted that, in some embodiments, the dies 150, 160, 170, 180, and 190 are known good dies (KGDs). That is, a die performance test is conducted to the dies 150, 160, 170, 180, and 190 to identify or select known good dies. As such, the dies 150, 160, 170, 180, and 190 are identified as the known good dies before the bonding, so as to increase the yield and the reliability after the bonding.

In some embodiments, the die 150 may be bonded on onto the hybrid path layer 140 by a plurality of conductive connectors 154. In some embodiments, the conductive connectors 154 may be BGA connectors, solder balls, metal pillars, controlled collapse chip connection (C4) bumps, micro bumps, electroless nickel-electroless palladium-immersion gold technique (ENEPIG) formed bumps, or the like. In the present embodiment, the conductive connectors 154 are micro bumps having a solder paste sandwiched between two metal posts. In some embodiments, the conductive connectors 154 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In some alternative embodiments, the die 150 may be bonded on onto the hybrid path layer 140 by a metal-to-metal bonding. That is, the conductive connectors 154 (e.g., copper pillars) may be in (direct) contact with the electrical path layer 144.

In addition, the die 150 further includes a passivation layer 152 laterally surrounding the conductive connectors 154. In some embodiments, the die 150 may be bonded on onto the electrical path layer 144 of the hybrid path layer 140 by a dielectric-to-dielectric bonding. That is, the passivation layer 152 (e.g., polyimide layer) may be in (direct) contact with the optical path layer 146 and/or the dielectric layer 142.

In the present embodiment, the die 150 is an electronic integrated circuit (EIC) die. The EIC die is a device having integration of electronic circuits and components onto a substrate of a semiconductor material by processes of fabrication. The substrate materials include, but are not limited to, silicon (Si), Silicon on insulator (SOI), germanium (Ge), indium phosphide (InP), gallium arsenide (GaAs), gallium nitride (GaN), or the like. Integrated electronic circuits include a combination of active electronic devices with passive components. The active electronic devices include, but are not limited to, transistors, diodes, etc. The passive components include, but are not limited to, resistors, capacitors, inductor, etc. The processes involved in the fabrication of integrated circuits can include, but are not limited to, vapor-phase deposition of semiconductors and insulators, oxidation, solid-state diffusion, ion implantation, vacuum deposition and sputtering, etc.

In some embodiments, the EIC die 150 may interconnect the PIC die 130 by the hybrid path layer 140. Specifically, the optical signal 135 from the optical fiber (not shown) at the first sidewall 100s of the bottom package 100 is transmitted to the PIC die 130 through the optical path layer 146, and then the PIC die 130 converts the optical signal 135 into an electrical signal and transmits it to the EIC die 150 through the electrical path layer 144. The PIC die 130 may be coupled to the EIC die 150 through the hybrid path layer 140 having the optical path layer 146 and the electrical path layer 144 extending on the same plane without through multiple layers of routing (especially in vertical direction). In this case, the die-to-die distance can be effectively reduced, thereby enhancing the signal transmission speed. In addition, a reflective prism 145 may be disposed in the optical path layer 146 to change a direction of the optical signal 135 from the optical fiber (not shown). Specifically, the reflective prism 145 may be formed by locally changing the refractive index in the optical path layer 146 to allow a reflection of the optical signal 135 from the optical path layer 146 to the PIC die 130 under the optical path layer 146. The refractive index may be modified by various methods. For example, a modification may include depositing a metal material (e.g., Ti/Cu layer) inside the polymer material of the optical path layer 146.

In some embodiments, the die 160 includes a first optical device die. The first optical device die may include any active or passive components, such as laser diodes, photodetectors, modulators, optical signal splitters, or other types of optical structures or devices. As shown in FIG. 1, the die 160 may be bonded onto the optical path layer 146 at the second side 140s2 of the hybrid path layer 140 away from the PIC die 130. In such embodiment, at least one optical path of the optical path layer 146 may extend from the PIC die 130 to the first optical device die 160, thereby optically coupling between the PIC die 130 and the first optical device die 160.

In some embodiments, the die 170 includes a second optical device die different from the first optical device die. The second optical device die may include any active or passive components, such as laser diodes, photodetectors, modulators, optical signal splitters, or other types of optical structures or devices. As shown in FIG. 1, the second optical device die 170 may be bonded onto the optical path layer 146 between the first side 140s1 and the second side 140s2 of the hybrid path layer 140. That is, the second optical device die 170 may be disposed between the PIC die 130 and the first optical device die 160. In such embodiment, the second optical device die 170 is configured to optically coupled to the first optical device die 160 through the optical path layer 146. For example, when the die 160 is a photodetector die and the die 170 is a laser diode die, the optical signal from the laser diode die 170 may be transmitted to the photodetector die 160 through the optical path layer 146 with the optical path extending from the laser diode die 170 to the photodetector die 160. In addition, a reflective prism 147 may be disposed in the optical path layer 146 to change a direction of the optical signal from the laser diode die 170. Specifically, the reflective prism 147 may be formed by locally changing the refractive index in the optical path layer 146 to allow a reflection of the optical signal from the laser diode die 170 to the optical path layer 146 under the laser diode die 170.

In some alternative embodiments, the first optical device die 160 may be the same as the second optical device die 170. Although FIG. 1 illustrates only two optical device dies 160 and 170, the embodiment of the disclosure is not limited thereto. In other embodiments, the number of the optical device die can be adjusted according to design requirements.

In some embodiments, the die 180 may be a package die. The package die may include one or more processing dies encapsulated in the encapsulant and bonded onto the interposer. The processing die may include, for example, a central processing unit (CPU), a graphics processing unit (GPU), an application-specific integrated circuit (ASIC), a high performance computing (HPC) die, the like, or a combination thereof. In the present embodiments, the die 190 is an ASIC die, but not limited thereto. Although FIG. 1 illustrates only one package die 180, the embodiment of the disclosure is not limited thereto. In other embodiments, the number of the package die can be adjusted according to design requirements.

In some embodiments, the die 190 may be a memory die including, for example, a volatile memory such as dynamic random-access memory (DRAM), static random-access memory (SRAM), another type of memory, or the like. For example, die 180 may be a high bandwidth memory (HBM) die. Although FIG. 1 illustrates only one memory die 190, the embodiment of the disclosure is not limited thereto. In other embodiments, the number of the memory die can be adjusted according to design requirements.

Further, the dies 150, 160, 170, 180, and 190 may have different heights and may be separated from each other by the blocking layers 148. In some embodiments, the dies 150, 160, 170, 180, and 190 are not encapsulated by the encapsulant or any molding compound. In this case, three sides of any one of the dies 150, 160, 170, 180, and 190 can be used for heat dissipation. That is, the heat generated from the dies 150, 160, 170, 180, and 190 (especially the EIC die 150 and the ASIC die 180) can be transferred out through the exposed sides.

Figure 3:
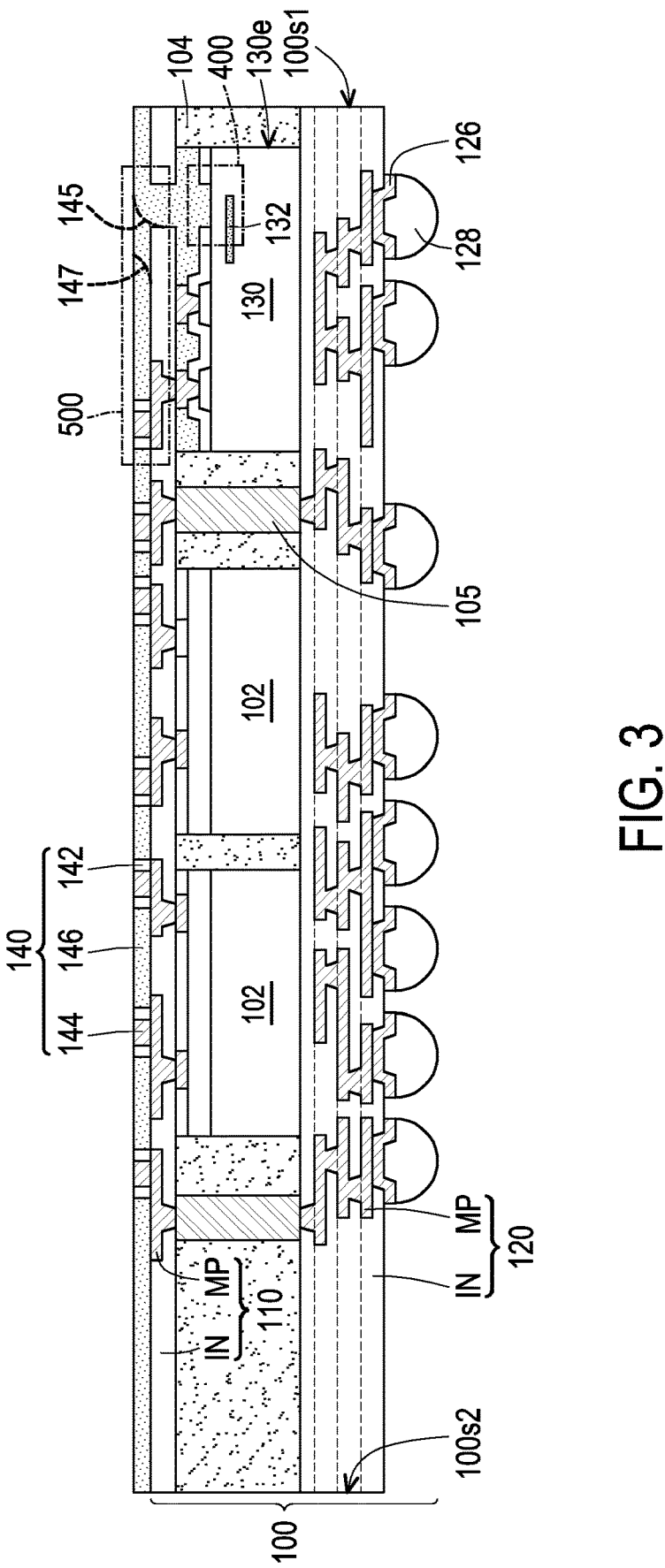
FIG. 3, FIG. 6, and FIG. 7 are cross-sectional views of intermediate stages in the formation of a package structure in accordance with some embodiments.
Figure 6:
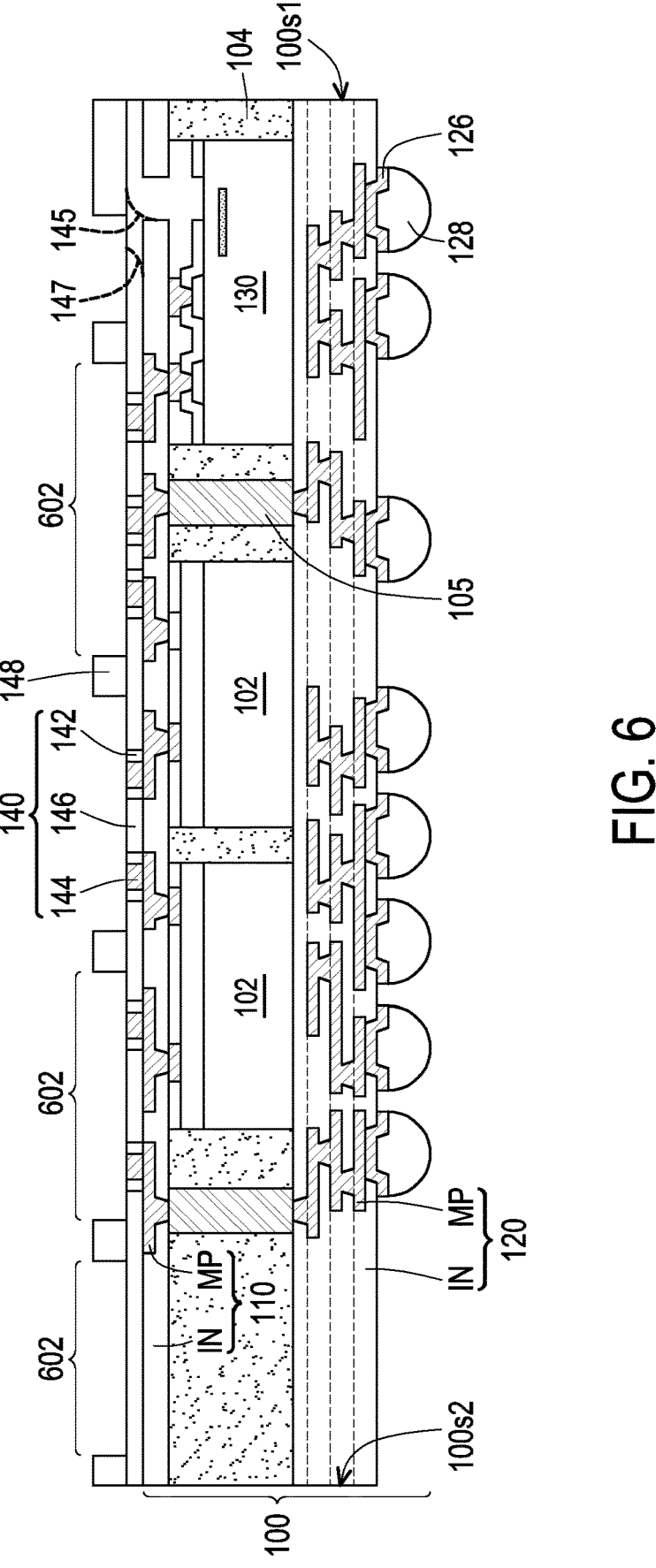
Figure 7:
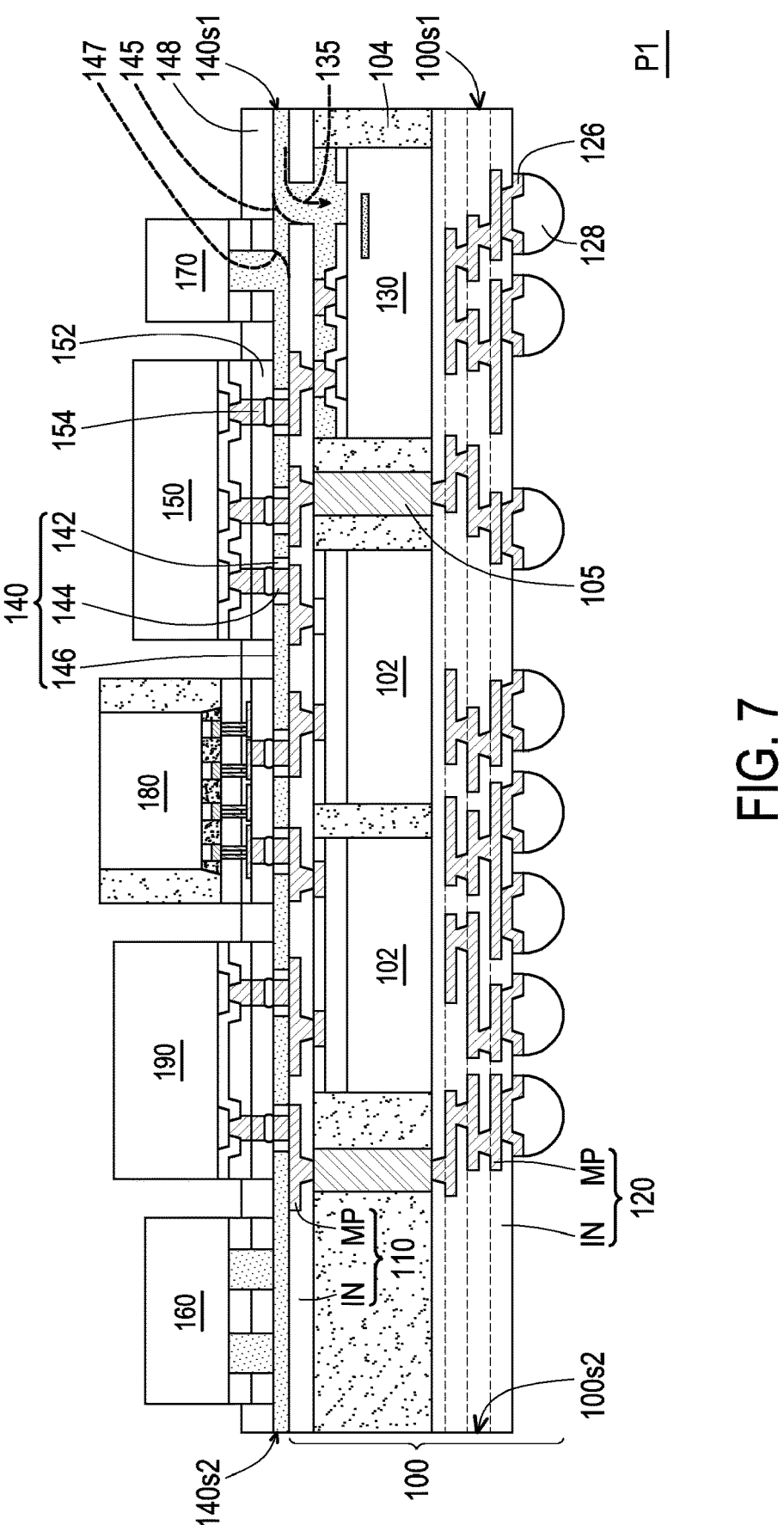

FIG. 3, FIG. 6, and FIG. 7 are cross-sectional views of intermediate stages in the formation of a package structure in accordance with some embodiments.

Referring to FIG. 3, first a bottom package 100 is formed. Specifically, the bottom package 100 may include one or more interconnect dies 102, an encapsulant 104, a plurality of through vias 105, a first redistribution structure 110, and a second redistribution structure 120, under-bump metallizations (UBM) 126, and conductive connectors 128. The interconnect dies 102, the through vias 105, and the PIC die 130 may be laterally encapsulated by the encapsulant 104. The first redistribution structure 110 may be formed on the top surfaces of the interconnect dies 102, the through vias 105, and the PIC die 130 and further extend to cover the top surface of the encapsulant 104. The second redistribution structure 120 may be formed on the bottom surfaces of the interconnect dies 102, the through vias 105, and the PIC die 130 and further extend to cover the bottom surface of the encapsulant 104. In some embodiments, the under-bump metallizations 126 are formed on and electrically couple to the second redistribution structure 120, and the conductive connectors 128 are formed on the under-bump metallizations 126.

Figure 4:
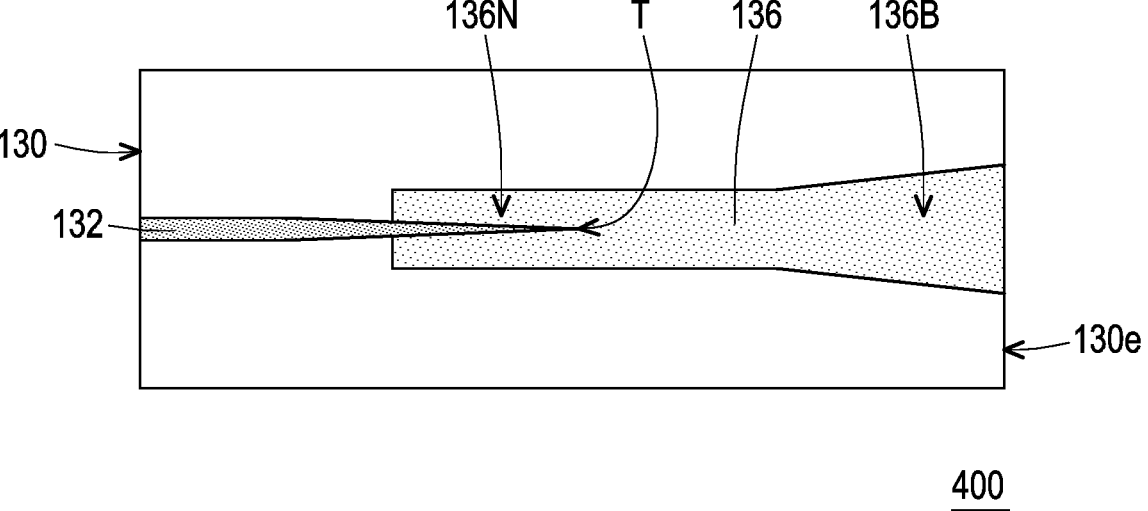
FIG. 4 is a partial plan view of the package structure of FIG. 3.

It should be noted that, in some embodiments, the PIC die 130 includes a silicon waveguide 132 consisting of a layer of silicon, as shown in FIG. 3. FIG. 4 illustrates a partial plan view of a region 400 of the package structure of FIG. 3. In detail, the silicon waveguide 132 may have a tip T facing toward an edge 130e of the PIC die 130 (or the first sidewall 100s of the bottom package 100). Since the tip T of the silicon waveguide 132 is too small to align the subsequent assembled optical fiber, the PIC die 130 further includes a polymer waveguide 136 with a horn-shaped structure to facilitate in the alignment between the silicon waveguide 132 and the optical fiber. Specifically, the polymer waveguide 136 may include a narrow portion 136N for aligning or overlapping the silicon waveguide 132, and a broaden portion 136B for aligning the subsequent assembled optical fiber at the edge 130e of the PIC die 130. In some embodiments, the width of the polymer waveguide 136 gradually increases along a direction from the narrow portion 136N to the broaden portion 136B.

After forming the bottom package 100, a hybrid path layer 140 may be formed on the bottom package 100. FIG. 5A to FIG. 5E illustrate the partial cross-sectional views of forming of the hybrid path layer 140, especially enlarge a region 500 of the package structure of FIG. 3.

Figure 5A:
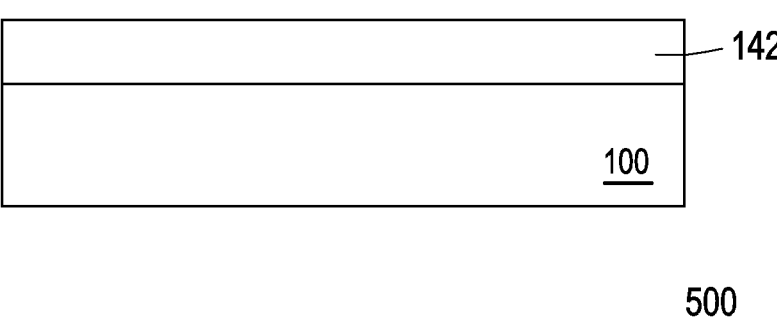
FIG. 5A to FIG. 5E are partial cross-sectional views of forming of a hybrid path layer of a package structure in accordance with some embodiments.

Referring to FIG. 5A, a dielectric layer 142 is formed on the bottom package 100. In some embodiments, the dielectric layer 142 is formed of a polymer material, which may also be a photosensitive material such as polybenzoxazole (PBO), polyimide (PI), benzocyclobutene (BCB), or the like, which may be easily patterned using a lithography process. In some other embodiments, the dielectric layer 142 is formed of an inorganic dielectric material, which may also be a non-photosensitive material such as silicon nitride, silicon oxide, PhosphoSilicate Glass (PSG), BoroSilicate Glass (BSG), Boron-doped PhosphoSilicate Glass (BPSG), or the like.

Figure 5B:
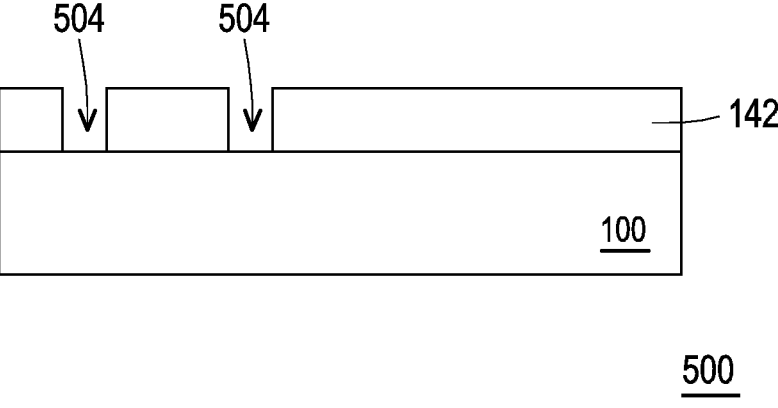

Referring to FIG. 5B, the dielectric layer 142 is then patterned to form a first opening 504 in the dielectric layer 142. In some embodiments, the first opening 504 may expose the metallization patterns MP of the first redistribution structure 110 in the bottom package 100 (FIG. 3).

Figure 5C:
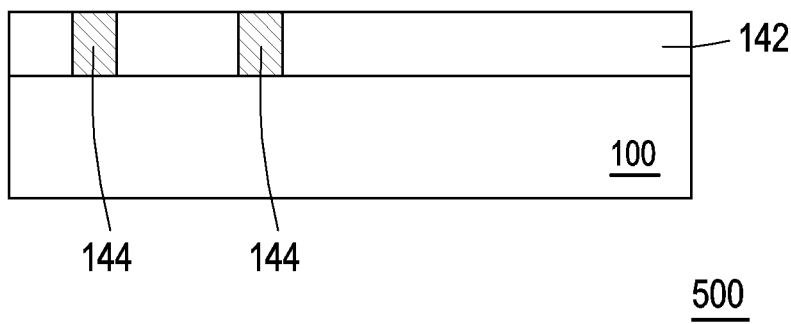

Referring to FIG. 5C, an electrical path layer 144 is formed in the first opening 504. The electrical path layer 144 may include a conductive material. In some embodiments, the conductive material includes metal, such as copper, nickel, titanium, a combination thereof or the like, and are formed by an electroplating process. In some alternatively embodiments, the electrical path layer 144 is formed by a CVD process or a PVD process. The PVD process is, for example, sputtering.

Figure 5D:
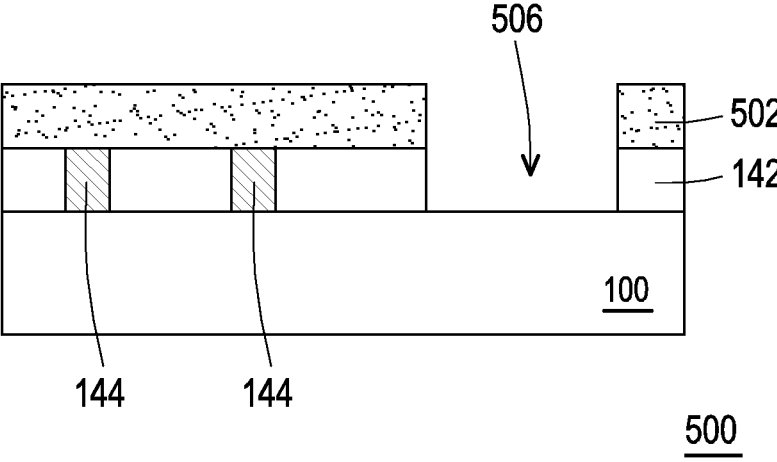

Referring to FIG. 5D, a photoresist pattern 502 is formed on the dielectric layer 142. The photoresist pattern 502 may cover the electrical path layer 144 and have an opening for defining the position of an optical path layer 146. In some embodiments, the photoresist pattern 502 includes a positive photoresist, a negative photoresist, a combination thereof, and/or the like, and is formed by spin coating. An etching process is then performed by using the photoresist pattern 502 as a mask, a portion of the dielectric layer 142 is removed to form a second opening 506 in the dielectric layer 142. The second opening 506 may expose a portion of the first redistribution structure 110 in the bottom package 100 (FIG. 3). In some embodiments, the etching process includes a dry etching process, such as a reactive-ion etching (RIE) process.

Figure 5E:
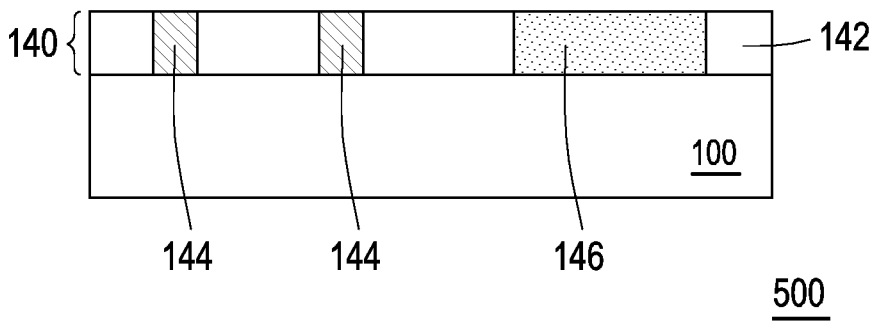

Referring to FIG. 5D and FIG. 5E, after removing the photoresist pattern 502, the optical path layer 146 is formed in the second opening 506, thereby accomplishing the hybrid path layer 140. The optical path layer 146 may have the refractive index greater than the refractive index of the dielectric layer 142, so that the total internal reflection may occur at the interface between the optical path layer 146 and the dielectric layer 142. In such embodiment, the optical path layer 146 may be referred to as the waveguide or the polymer waveguide. In some embodiments, the optical path layer 146 includes a polymer material, such as polyimide, polyolefin, polybenzoxazole (PBO), benzocyclobutene (BCB), polynorbornene, acrylate, epoxy, siloxane, a combination thereof, or the like. In some alternative embodiments, the optical path layer 146 includes silicon oxide or silicon nitride. However, the embodiment of the disclosure is not limited thereto, the materials may be selected for the optical path layer 146 and the dielectric layer 142 in order to achieve the desired refractive index relationships.

Although FIG. 5A to FIG. 5E are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. For example, the order in which the electrical path layer 144 and the optical path layer 146 are formed is not limited. In some embodiments, the electrical path layer 144 is formed before forming the optical path layer 146. In some alternative embodiments, the electrical path layer 144 is formed after forming the optical path layer 146.

Referring to FIG. 6, after forming the hybrid path layer 140, a blocking layer 148 is formed on the hybrid path layer 140. The blocking layer 148 may define the bonding positions 602 for accommodating the dies 150, 160, 170, 180, and 190. In some embodiments, the blocking layer 148 is formed of a polymer material, which may also be a photosensitive material such as PBO, PI, BCB, or the like, which may be easily patterned using a lithography process. In some other embodiments, the blocking layer 148 is formed of an inorganic dielectric material, which may also be a non-photosensitive material such as silicon nitride, silicon oxide, PSG, BSG, BPSG, or the like. To support the design of the waveguide, the blocking layer 148 has the refractive index less than the refractive index of the optical path layer 146, so that the total internal reflection may occur at the interface between the optical path layer 146 and the blocking layer 148. In some embodiments, the blocking layer 148 and the dielectric layer 142 have the same material to wrap the optical path layer 146. In some alternative embodiments, the blocking layer 148 and the dielectric layer 142 have different materials.

Referring to FIG. 7, the dies 150, 160, 170, 180, and 190 may be bonded onto the hybrid path layer 140 to accomplish the package structure P1. The configuration, function, material of the dies 150, 160, 170, 180, and 190 have been described in the above-mentioned embodiments, and will not be repeated here.

Figure 8:
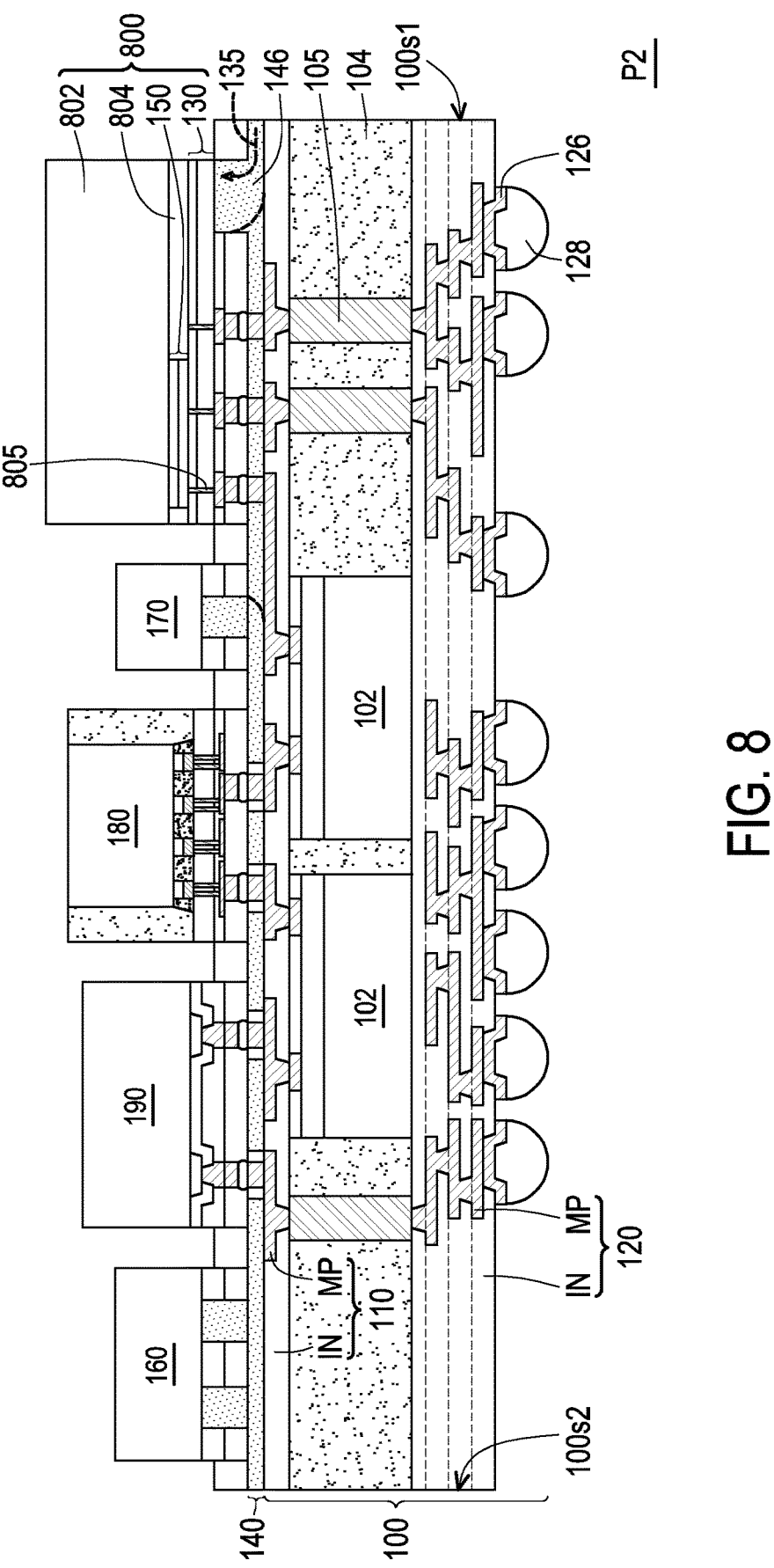
FIG. 8 is a cross-sectional view showing a package structure in accordance with some alternative embodiments.

FIG. 8 is a cross-sectional view showing a package structure in accordance with some alternative embodiments.

Referring to FIG. 8, a package structure P2 is similar to the package structure P1 of FIG. 1, with similar features being labeled with similar numerical references, and descriptions of the similar features are not repeated herein. In the present embodiment, the package structure P2 includes a package die 800 having a PIC die 130 and a EIC die 150 stacked on the PIC die 130. Specifically, the package die 800 may include a supporting carrier 802, the PIC die 130, and the EIC die 150. The EIC die 150 may be vertically sandwiched between the PIC die 130 and the supporting carrier 802. The package die 800 further includes a gap filling material 804 laterally surrounding the EIC die 150. In such embodiment, the PIC die 130 may interconnect the EIC die 150 by through substrate vias (TSVs) 805 penetrating through a substrate of the PIC die 130.

It should be noted that, in some embodiments, the optical signal 135 from the optical fiber (not shown) at the first sidewall 100s of the bottom package 100 is transmitted to the PIC die 130 through the optical path layer 146, and then the PIC die 130 converts the optical signal 135 into an electrical signal and transmits it to the EIC die 150 through the TSVs 805. In this case, the die-to-die distance can be further reduced, thereby enhancing the signal transmission speed. In addition, the supporting carrier 802 made of a silicon material may be in contact with the EIC die 150 to dissipate the heat generated from the EIC die 150, thereby achieving effective thermal solution. Further, the electrical path layer 144 and the optical path layer 146 may extend on the same plane, and at least one optical path of the optical path layer 146 may extend from the first sidewall 100s1 of the bottom package 100 to the second sidewall 100s2 opposite to the first sidewall 100s1. In such embodiment, the optical path layer 146 may be referred to as the high-speed optical way to achieve high optical transmission speed. As a result, more optical devices can be bonded in the same level of the package structure P2, so that the configuration of the package structure P2 is more flexible.

According to some embodiments, a package structure includes a bottom package having a first sidewall and a second sidewall opposite to each other; a hybrid path layer disposed on the bottom package, wherein the hybrid path layer comprises an optical path layer and an electrical path layer, and at least one optical path of the optical path layer extends from the first sidewall of the bottom package beyond a center of the bottom package; and a plurality of dies bonded onto the hybrid path layer.

In some embodiments, the at least one optical path of the optical path layer extends from the first sidewall of the bottom package to the second sidewall of the bottom package. In some embodiments, the optical path layer is separated from the electrical path layer by a dielectric layer. In some embodiments, the optical path layer has a refractive index greater than a refractive index of the dielectric layer. In some embodiments, a material of the optical path layer comprises a polymer material, and a material of the electrical path layer comprises a conductive material. In some embodiments, the bottom package comprises at least one photonic integrated circuit (PIC) die, the plurality of dies comprise at least one electronic integrated circuit (EIC) die, and the at least one PIC die interconnects the at least one EIC die by the hybrid path layer. In some embodiments, the package structure further includes a blocking layer disposed on the hybrid path layer between the plurality of dies, wherein the blocking layer has a refractive index less than a refractive index of the optical path layer. In some embodiments, the plurality of dies comprise at least one package die, the least one package die comprises a PIC die and a EIC die stacked on the PIC die, and the PIC die interconnects the EIC die by through substrate vias (TSVs) penetrating through a substrate of the PIC die. In some embodiments, the bottom package comprises at least one interconnect die embedded in an encapsulant to interconnect at least two of the plurality of dies.

According to some embodiments, a package structure includes a hybrid path layer having an optical path layer and an electrical path layer extending on the same plane; a photonic integrated circuit (PIC) die configured to optically coupled to an optical fiber at a first side of the hybrid path layer through the optical path layer; and a first optical device bonded onto the optical path layer at a second side of the hybrid path layer away from the PIC die.

In some embodiments, at least one optical path of the optical path layer extends from the first side of the hybrid path layer to the second side of the hybrid path layer. In some embodiments, at least one optical path of the optical path layer extends from the PIC die to the first optical device. In some embodiments, the package structure further includes a reflective prism disposed in the optical path layer to change a direction of an optical signal from the optical fiber. In some embodiments, the package structure further includes a second optical device bonded onto the optical path layer between the first side and the second side of the hybrid path layer, wherein the second optical device is configured to optically coupled to the first optical device through the optical path layer. In some embodiments, the optical path layer is separated from the electrical path layer by a dielectric layer. In some embodiments, the optical path layer has a refractive index greater than a refractive index of the dielectric layer.

According to some embodiments, a method of forming a package structure includes: forming a bottom package; forming a hybrid path layer on the bottom package, wherein the hybrid path layer has an optical path layer and an electrical path layer extending on the same plane; and bonding a plurality of dies onto the hybrid path layer.

In some embodiments, the forming the hybrid path layer includes: forming a dielectric layer to cover the bottom package; patterning the dielectric layer to form a first opening and a second opening in the dielectric layer; forming the electrical path layer in the first opening; and forming the optical path layer in the second opening. In some embodiments, the optical path layer is separated from the electrical path layer by the dielectric layer. In some embodiments, before bonding the plurality of dies onto the hybrid path layer, the method further comprises forming a blocking layer on the hybrid path layer to define bonding positions for accommodating the plurality of dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a bottom package having a first sidewall and a second sidewall opposite to each other;
   a hybrid path layer disposed on the bottom package, wherein the hybrid path layer comprises an optical path layer and an electrical path layer, and at least one optical path of the optical path layer extends from the first sidewall of the bottom package to the second sidewall of the bottom package; and
   a plurality of dies bonded onto the hybrid path layer.

2. The package structure of claim 1, wherein the optical path layer is separated from the electrical path layer by a dielectric layer.

3. The package structure of claim 2, wherein the optical path layer has a refractive index greater than a refractive index of the dielectric layer.

4. The package structure of claim 1, wherein a material of the optical path layer comprises a polymer material, and a material of the electrical path layer comprises a conductive material.

5. The package structure of claim 1, wherein the bottom package comprises at least one photonic integrated circuit (PIC) die, the plurality of dies comprise at least one electronic integrated circuit (EIC) die, and the at least one PIC die interconnects the at least one EIC die by the hybrid path layer.

6. The package structure of claim 1, further comprising a blocking layer disposed on the hybrid path layer between the plurality of dies, wherein the blocking layer has a refractive index less than a refractive index of the optical path layer.

7. The package structure of claim 1, wherein the plurality of dies comprise at least one package die, the least one package die comprises a PIC die and a EIC die stacked on the PIC die, and the PIC die interconnects the EIC die by through substrate vias (TSVs) penetrating through a substrate of the PIC die.

8. The package structure of claim 1, wherein the bottom package comprises at least one interconnect die embedded in an encapsulant to interconnect at least two of the plurality of dies.

13

14

9. A package structure, comprising:

a hybrid path layer having an optical path layer and an electrical path layer extending on the same plane;

a photonic integrated circuit (PIC) die configured to optically coupled to an optical fiber at a first side of the hybrid path layer through the optical path layer; and a first optical device bonded onto the optical path layer at a second side of the hybrid path layer away from the PIC die.

10. The package structure of claim 9, wherein at least one optical path of the optical path layer extends from the first side of the hybrid path layer to the second side of the hybrid path layer.

11. The package structure of claim 9, wherein at least one optical path of the optical path layer extends from the PIC die to the first optical device.

12. The package structure of claim 9, further comprising a reflective prism disposed in the optical path layer to change a direction of an optical signal from the optical fiber.

13. The package structure of claim 9, further comprising a second optical device bonded onto the optical path layer between the first side and the second side of the hybrid path layer, wherein the second optical device is configured to optically coupled to the first optical device through the optical path layer.

14. The package structure of claim 9, wherein the optical path layer is separated from the electrical path layer by a dielectric layer.

15. The package structure of claim 14, wherein the optical path layer has a refractive index greater than a refractive index of the dielectric layer.

16. A method of forming a package structure, comprising:

forming a bottom package having a first sidewall and a second sidewall opposite to each other;

forming a hybrid path layer on the bottom package, wherein the hybrid path layer has an optical path layer and an electrical path layer extending on the same plane, and at least one optical path of the optical path layer extends from the first sidewall of the bottom package to the second sidewall of the bottom package; and bonding a plurality of dies onto the hybrid path layer.

17. The method of claim 16, wherein the forming the hybrid path layer comprises:

forming a dielectric layer to cover the bottom package;

patterning the dielectric layer to form a first opening and a second opening in the dielectric layer;

forming the electrical path layer in the first opening; and forming the optical path layer in the second opening.

18. The method of claim 17, wherein the optical path layer is separated from the electrical path layer by the dielectric layer.

19. The method of claim 16, wherein before bonding the plurality of dies onto the hybrid path layer, the method further comprises forming a blocking layer on the hybrid path layer to define bonding positions for accommodating the plurality of dies.

20. The method of claim 16, wherein a material of the optical path layer comprises a polymer material, and a material of the electrical path layer comprises a conductive material.

* * * * *